(12) United States Patent
Adetutu et al.

(10) Patent No.: US 6,897,095 B1
(45) Date of Patent: May 24, 2005

(54) SEMICONDUCTOR PROCESS AND INTEGRATED CIRCUIT HAVING DUAL METAL OXIDE GATE DIELECTRIC WITH SINGLE METAL GATE ELECTRODE

(75) Inventors: Olubunmi O. Adetutu, Austin, TX (US); Srikanth B. Samavedam, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/843,850

(22) Filed: May 12, 2004

(51) Int. Cl.[7] .......................................... H01L 21/8238
(52) U.S. Cl. ........................ 438/119; 438/217; 438/227; 438/231; 438/302; 438/305; 257/493; 257/497; 257/506; 257/511; 257/521
(58) Field of Search ................................ 438/199, 217, 438/227, 231, 302, 305; 257/493, 497, 506, 511, 521

(56) References Cited

U.S. PATENT DOCUMENTS

| | | | |
|---|---|---|---|
| 5,686,324 A | * | 11/1997 | Wang et al. ................. 438/231 |
| 5,827,747 A | * | 10/1998 | Wang et al. ................. 438/199 |
| 6,084,279 A | | 7/2000 | Nguyen et al. |
| 6,528,858 B1 | | 3/2003 | Yu et al. |
| 6,545,324 B2 | | 4/2003 | Madhukar et al. |

* cited by examiner

Primary Examiner—Matthew Smith
Assistant Examiner—Victor V Yevsikov
(74) Attorney, Agent, or Firm—Joseph P. Lally

(57) ABSTRACT

A semiconductor fabrication process includes forming first and second transistors over first and second well regions, respectively where the first transistor has a first gate dielectric and the second transistor has a second gate dielectric different from the first gate dielectric. The first transistor has a first gate electrode and the second transistor has a second gate electrode. The first and second gate electrodes are the same in composition. The first gate dielectric and the second gate dielectric may both include high-K dielectrics such as Hafnium oxide and Aluminum oxide. The first and second gate electrodes both include a gate electrode layer overlying the respective gate dielectrics. The gate electrode layer is preferably either TaSiN and TaC. The first and second gate electrodes may both include a conductive layer overlying the gate electrode layer. In one such embodiment, the conductive layer may include polysilicon and tungsten.

23 Claims, 7 Drawing Sheets

US 6,897,095 B1

SEMICONDUCTOR PROCESS AND INTEGRATED CIRCUIT HAVING DUAL METAL OXIDE GATE DIELECTRIC WITH SINGLE METAL GATE ELECTRODE

FIELD OF THE INVENTION

The invention is in the field of semiconductor fabrication processes and, more particularly, in the field of complementary metal oxide semiconductor (CMOS) semiconductor processes.

RELATED ART

Conventional CMOS fabrication processes have traditionally used a single gate dielectric for both PMOS and NMOS transistors. The traditional gate dielectrics include $SiO_2$, SiON, and $Si_3N_4$. As the thickness of these dielectrics ($t_{ox}$) has been progressively scaled down to accommodate smaller devices, gate leakage has increased due to direct tunneling. In addition, gate capacitance due to polysilicon depletion effects in thin oxide transistors has become undesirably significant.

Materials having high dielectric constants (high K materials) have been used to address some of the problems associated with thin gate dielectrics. A high K dielectric transistor can be fabricated with relatively thick gate dielectric and still achieve the same capacitance effect as a conventional transistor having a relatively thin gate dielectric. The high K materials that have been most widely implemented include metal-oxide compounds such as hafnium oxide (e.g., $HfO_2$) aluminum oxide (e.g., $Al_2O_3$), and their derivatives.

While high K materials beneficially alleviate the dielectric thickness problem, it has been observed that the high K materials have an unintended and asymmetrical effect on the threshold voltages of NMOS and PMOS transistors. It is theorized that a hafnium oxide metal oxide gate dielectric tends to pin the work function of the gate electrode towards midband, which has a negative impact on device parameters including threshold voltage and drive current. Moreover, this Fermi pinning for metal oxide gate compounds such as Hafnium oxide is more prominent in PMOS transistors than NMOS transistors, (i.e., the device parameters of PMOS transistors are affected more than those of NMOS transistors), especially when using doped polysilicon as the gate electrode. It would be desirable to implement a process that incorporated high K materials to address problems associated with very thin gate dielectrics while also addressing the asymmetrical shifts in device properties observable when a single, high k gate dielectric is used. It would be further desirable if the implemented process used a single gate electrode material to simplify the process flow.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the invention is a CMOS fabrication process that integrates the use of two different gate dielectrics with a single gate electrode. The different gate dielectrics compensate for differences in gate electrode material while use of a single gate electrode simplifies the process flow and reduces the cost of the process. Two different specific process flows or integration techniques are described explicitly.

Figure 1:
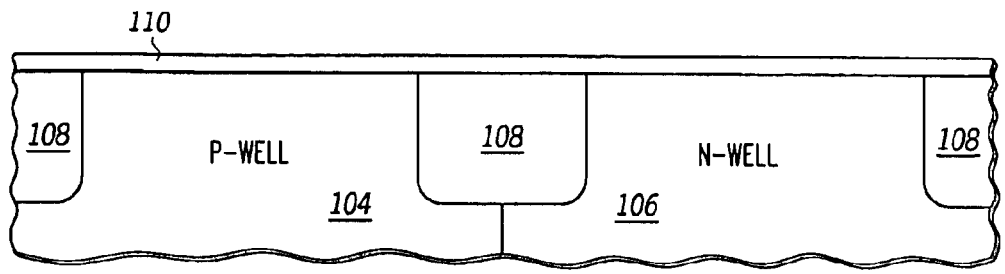
FIG. 1 is a partial cross-sectional view of a semiconductor wafer in which a first gate dielectric layer is formed over the wafer.

Referring now to FIG. 1, a partial cross sectional view of a semiconductor wafer 102 shown at an intermediate step in the process flow is shown. In the depicted embodiment, wafer 102 includes a first well region 104 (also referred to as first well 104) and a second well region 106 (second well 106) that are laterally displaced with respect to one another. First well 104 and second well 106 contain impurities of opposing polarities such that one of the wells is a p-doped well and one of the wells is an n-doped well. In the described embodiment, first well 104 is a p-doped well (p-well) in which NMOS transistors are formed and second well 106 is an n-doped well (n-well) in which PMOS transistors are formed.

Isolation dielectric trenches 108 have been fabricated within wafer 102. As their names imply, isolation dielectric trenches 108 serve to provide electrical and physical isolation between adjacent devices (transistors). Isolation dielectric trenches 108 are preferably comprised of a silicon-oxide (or other dielectric) compound formed by etching trenches into wafer 102, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer 102 is thermally oxidized to form the isolation dielectric.

Following the formation of wells 104 and 106 and isolation trenches 108, a first gate dielectric 110 is blanket deposited across the entire wafer 102. First dielectric will serve as the gate dielectric for a first type of transistors. In the described embodiment, first dielectric 110 will serve as the gate dielectric for the transistors formed overlying first well 104. In an embodiment in which first well 104 is a p-well, first gate dielectric 110 is the gate dielectric used in the NMOS transistors. In one such implementation, first dielectric 110 is a metal oxide compound formed by chemical vapor deposition. A metal oxide compound desirable for use as first dielectric 110 is lanthanum oxide (preferably $La_2O_3$). A typical thickness of first gate dielectric is in the range of 0.5–10 nanometers.

Figure 2:
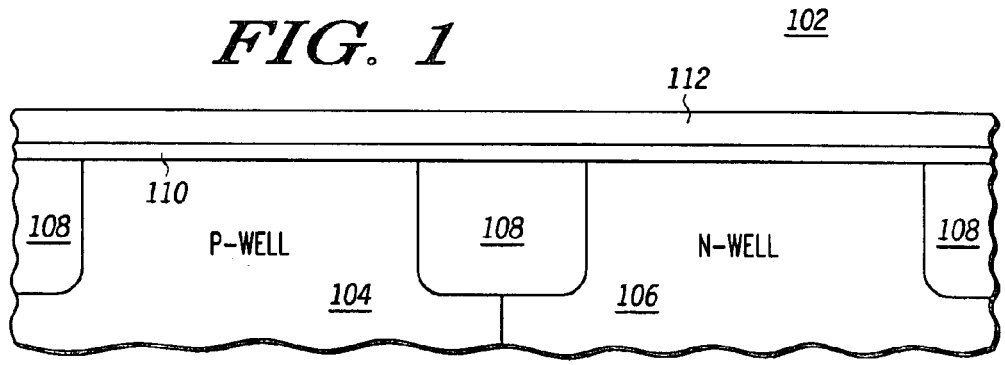
FIG. 2 illustrates processing subsequent to FIG. 1 in which a gate electrode layer is formed over the first gate dielectric layer.
Figure 3:
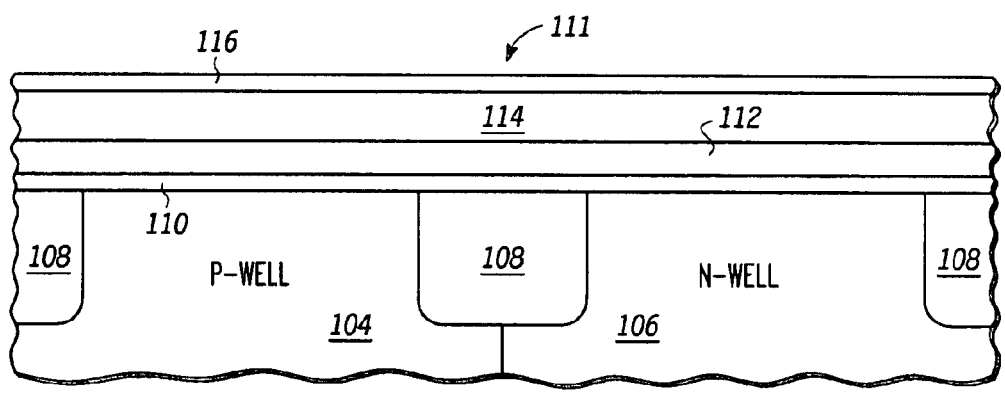
FIG. 3 illustrates processing subsequent to FIG. 2 in which a conductive layer and an antireflective coating are formed over the gate electrode layer.

Referring now to FIG. 2 and FIG. 3, after forming first dielectric 110, a first gate stack 111 is formed by depositing, sequentially, a gate electrode layer 112, a conductive layer 114, and an antireflective coating (ARC) 116 over first dielectric 110. In one embodiment, gate electrode layer 112 is a TaSiN layer preferably having a thickness in the range of 1–20 nanometers. In another embodiment, gate electrode layer 112 is a TaC layer having a thickness in the range of 1–20 nanometers.

The conductive layer 114 is an optional layer that may be used, for example, to simplify integration issues. Conductive layer 114 is preferably heavily doped polysilicon, tungsten, or another suitable electrically conductive material having a thickness in the range of approximately 10–100 nanometers. Antireflective coating (ARC) 116 is a relatively thin layer used to facilitate a subsequent photolithography step as is well known in the field of semiconductor fabrication. ARC 116 may be comprised of $Si_xN_y$ or a polymer that is highly absorbing at the photolithography exposure wavelength.

Figure 4:
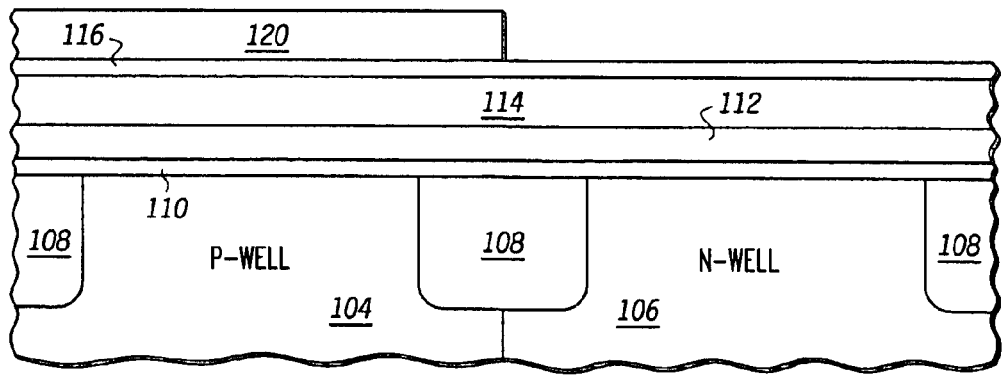
FIG. 4 illustrates processing subsequent to FIG. 3 in which a hard mask is formed over a first portion of the antireflective coating.

Turning now to FIG. 4, following formation of ARC 116, a hard mask 120 is selectively formed over ARC 116 above first well region 104. Hard disk 120 is preferably a silicon oxide layer formed by CVD. Hard mask 120 serves to protect first gate stack 111 over first well region 104 during formation of a comparable gate stack over second well region 106.

Figure 5:
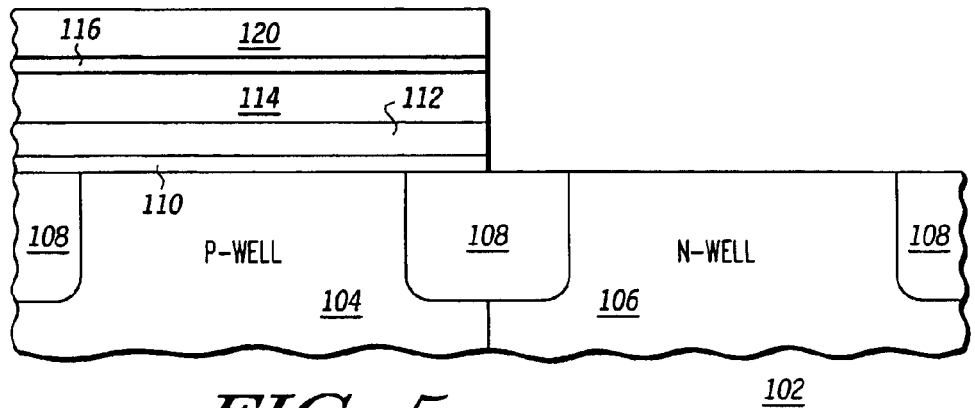
FIG. 5 illustrates processing subsequent to FIG. 4 in which exposed portions of the antireflective coating, conductive layer, and gate electrode layer are removed.

Turning now to FIG. 5, following the patterning of hard mask 120, the exposed portions of first gate stack 111 are removed. The exposed portions of gate stack 111 include the portions of the gate stack above second well region 106. The removal of the portions of gate stack above second well region 106 exposes an upper surface of wafer 106 above the second well region 106 while maintaining a protective coating over the portions of gate stack 111 above first well region 104.

Figure 6:
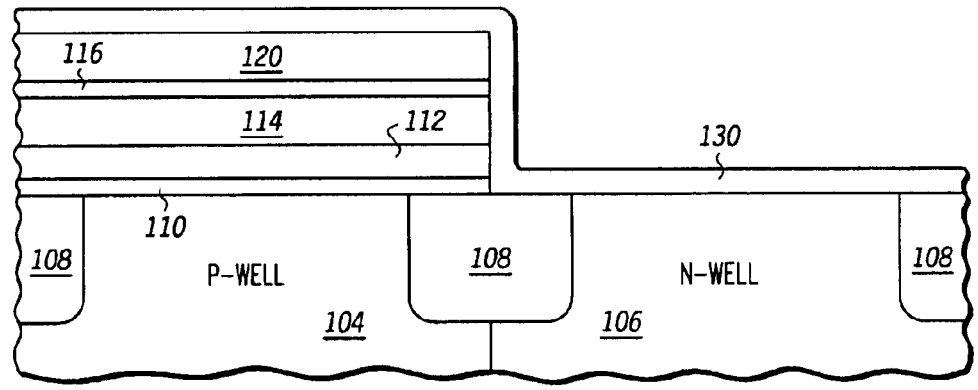
FIG. 6 illustrates processing subsequent to FIG. 5 in which a second gate dielectric is formed over a second portion of the wafer.

Turning to FIG. 6, a second gate dielectric 130 is deposited non-selectively over wafer 102. Second gate dielectric 130 is a different material than first gate dielectric 110 and the thickness of second gate dielectric 130 over second well region 106 may be different than the thickness of first gate dielectric 110 over first well region 104. In one embodiment of the invention, it is significant that first gate dielectric 110 and second gate dielectric 130 are both high k dielectrics. For purposes of this disclosure a high k dielectric is a dielectric having a dielectric constant that is at least 1.5 times the dielectric constant of $SiO_2$. In one such embodiment suitable for its use in conjunction with PMOS transistors having a tantalum-based gate electrode, second gate dielectric 130 comprises a deposited Aluminum oxide film having a thickness in the range of 0.5–10 nanometers.

Figure 7:
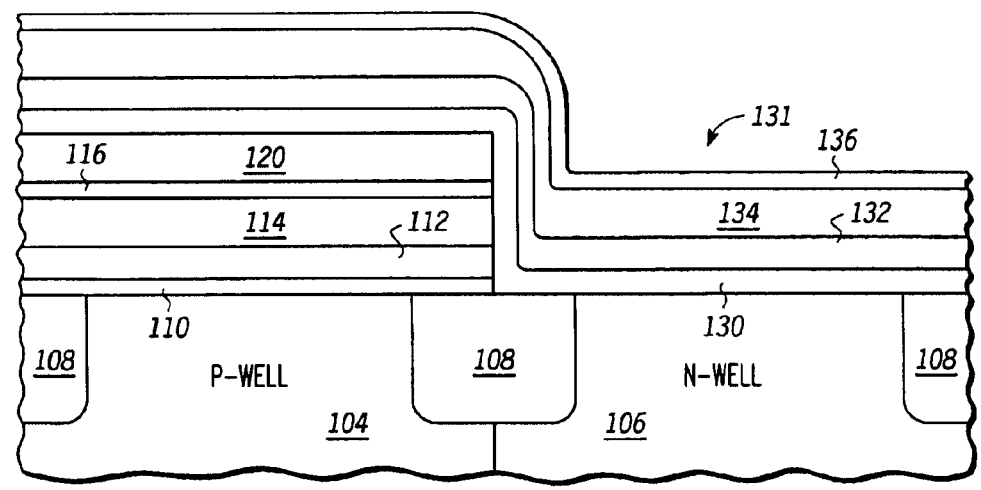
FIG. 7 illustrates processing subsequent to FIG. 6 in which a second gate electrode layer, conductive layer, and antireflective coating are formed over the second gate dielectric.

In FIG. 7, a second gate stack 131 is formed by depositing, sequentially, a second gate electrode film 132 over second gate dielectric 130, a second conductive film 134 over second gate electrode film 132, and a second ARC film 136 over second conductive film 134. In one embodiment, second gate stack 131 parallels first gate stack 111 in that second gate electrode 132 has the same composition and thickness as first gate electrode film 112, second conductive film 134 has the same composition and thickness as first conductive film 114, and second ARC 136 has the same composition and thickness as first ARC 116. In embodiments that omit the optional first conductive layer 114, second conductive layer 134 would be omitted from second gate stack 131 and so forth such that first and second gate stacks 111 ad 131 are substantially similar in composition and dimension (thickness).

Figure 8:
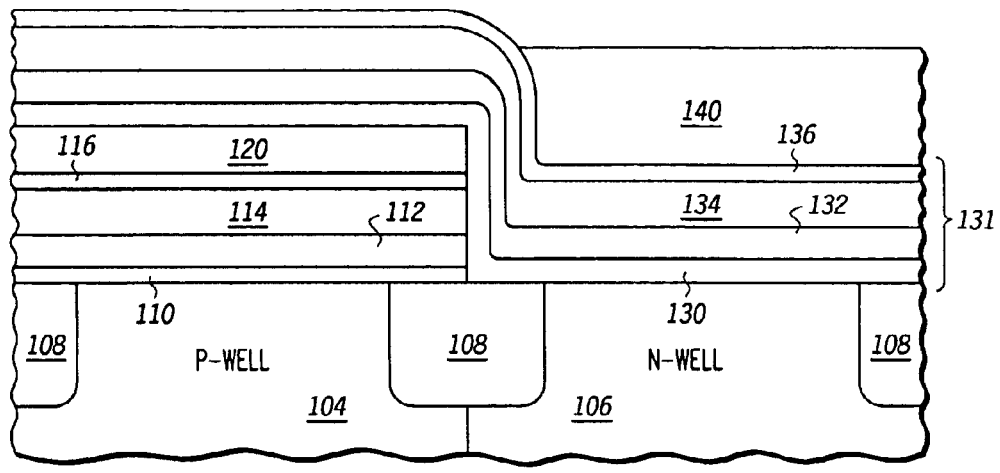
FIG. 8 illustrates processing subsequent to FIG. 7 in which a photoresist mask is formed over the second portion of the wafer.
Figure 9:
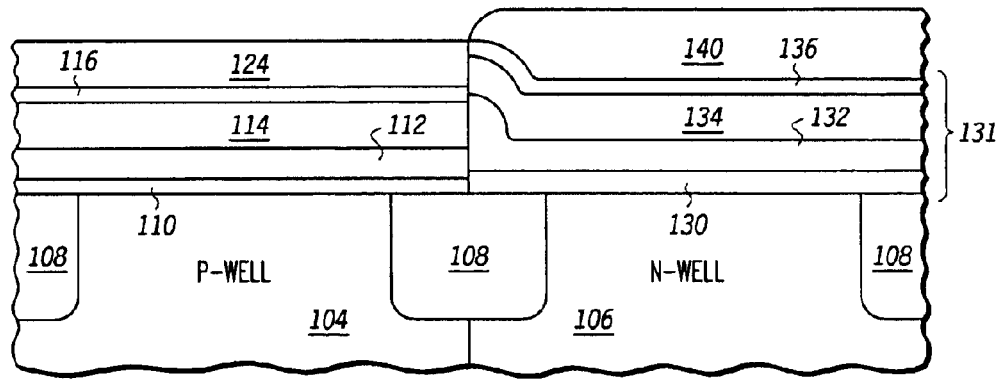
FIG. 9 illustrates processing subsequent to FIG. 8 in which exposed portions of the second antireflective coating, conductive layer, and gate electrode layer are removed.

In FIG. 8 and FIG. 9, a photoresist mask 140 is patterned above second gate stack 131 over second well region 106. The exposed portions of second gate stack 131 (those portions not above second well region 106) are then removed using an etch sequence substantially similar to the etch sequence used to remove portions of first gate stack 111. Following the removal of the exposed portions of second gate stack 131, the remaining portions of photoresist layer 140 shown in FIG. 9, as well as the remaining portions of hard mask 120 shown in FIG. 9 are stripped before continuing with additional processing.

Figure 10:
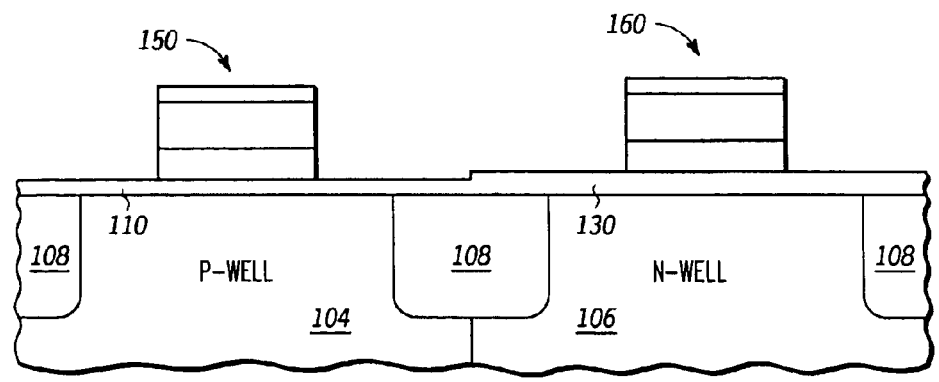
FIG. 10 illustrates processing subsequent to FIG. 9 in which first and second gate electrodes are formed over the first and second portions of the wafer.

In FIG. 10, a conventional gate electrode etch sequence has been performed to produce first and second transistors 150 and 160 above first and second well regions 104 and 106 respectively. First and second transistors 150 and 160 are preferably opposite in polarity such that, for example, first transistor 150 is an NMOS transistor and second transistor 160 is a PMOS transistor. The gate dielectrics of first and second transistors 150 and 160 differ in composition. As described above, for example, first gate dielectric 110 may be comprised of a first material such as Lanthanum oxide while second gate dielectric 130 may be comprised of a second material such as Aluminum oxide. Moreover, whereas first and second transistors 150 and 160 are of different polarity and have different gate dielectrics, the gate electrode of both transistors is substantially equal in both composition and thickness.

Those skilled in semiconductor fabrication will appreciate that additional, conventional processing steps (not depicted) are performed to complete the fabrication of first and second transistors 150 and 160. As examples, one or more extension implant, halo implant, spacer formation, and source/drain implant steps may be performed to complete the transistors. In addition, conventional backend processing (not depicted) typically including multiple levels of interconnect is then required to connect the transistors in a desired manner to achieve the desired functionality.

In FIGS. 11 through 15, relevant portions of a second embodiment of a fabrication process according to the present invention is depicted. Prior to FIG. 1 in this second embodiment, the processing sequence shown in and described with respect to FIGS. 1 through 3 is performed. Thereafter, however, the processing sequence differs from the sequence depicted in FIGS. 4 through 10.

Figure 11:
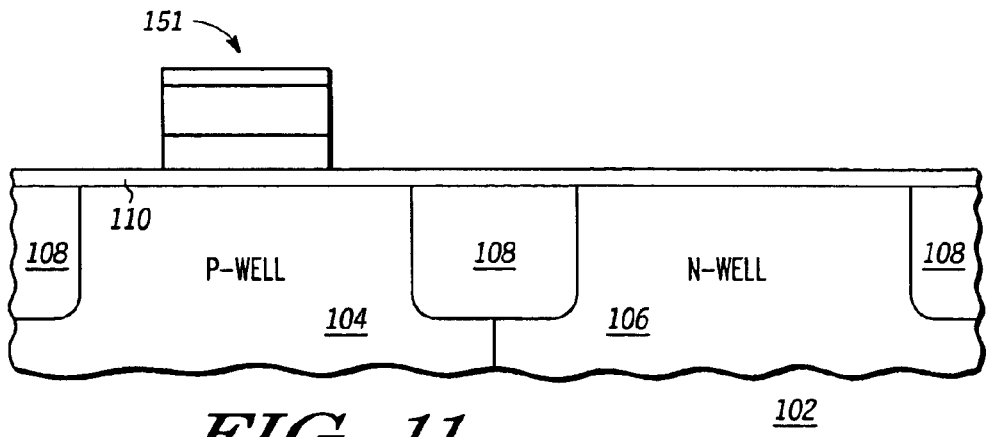
FIG. 11 illustrates processing subsequent to FIG. 3, according to a second embodiment of the invention, in which a first gate electrode is formed over a first portion of the wafer.

Referring to FIG. 11, following the formation of first gate stack 111 over first gate dielectric 110 as shown in FIG. 3, a gate electrode 151 above first well region 104 is formed from first gate stack 111 using a conventional gate electrode formation sequence. Specifically, gate electrode 151 is formed by patterning a photoresist layer over first gate stack 111 that exposes gate stack 111 except where the desired gate electrode 151 will be formed. Thereafter, first gate stack 111 is etched using a conventional gate electrode etch processing sequence.

Figure 12:
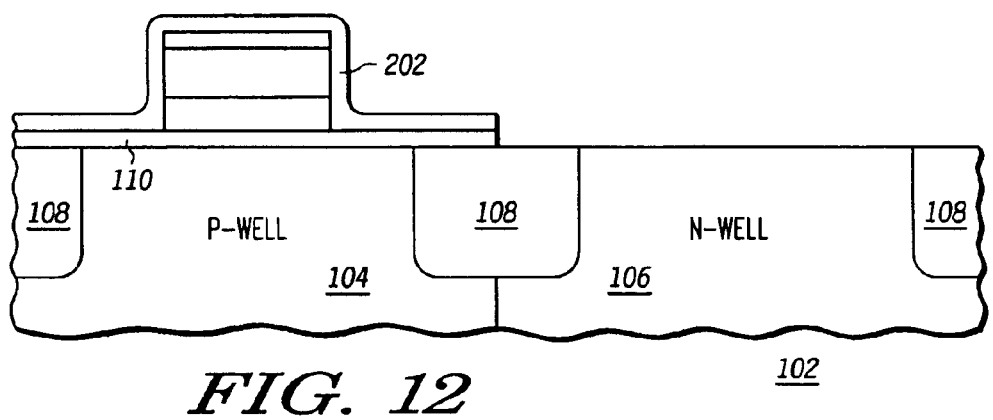
FIG. 12 illustrates processing subsequent to FIG. 11 in which a hard mask is formed over the first gate electrode.
Figure 13:
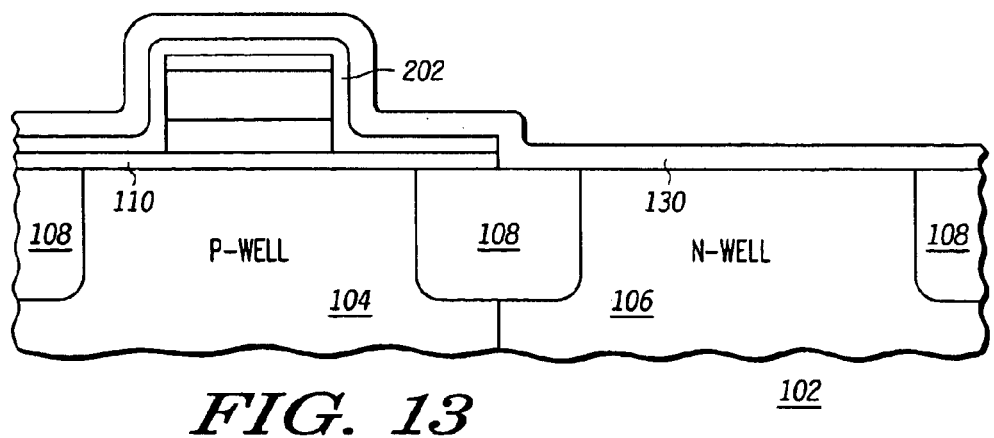
FIG. 13 illustrates processing subsequent to FIG. 12 in which a second gate dielectric is formed over the second portion of the wafer.

In FIG. 12, a hard mask 202, preferably comprised of silicon nitride, is deposited over wafer 102 and selectively etched to remove portions of the hard mask above second well region 106 to expose an upper surface of the second well region 106. The second gate dielectric 130 is then deposited, as shown in FIG. 13.

Figure 14:
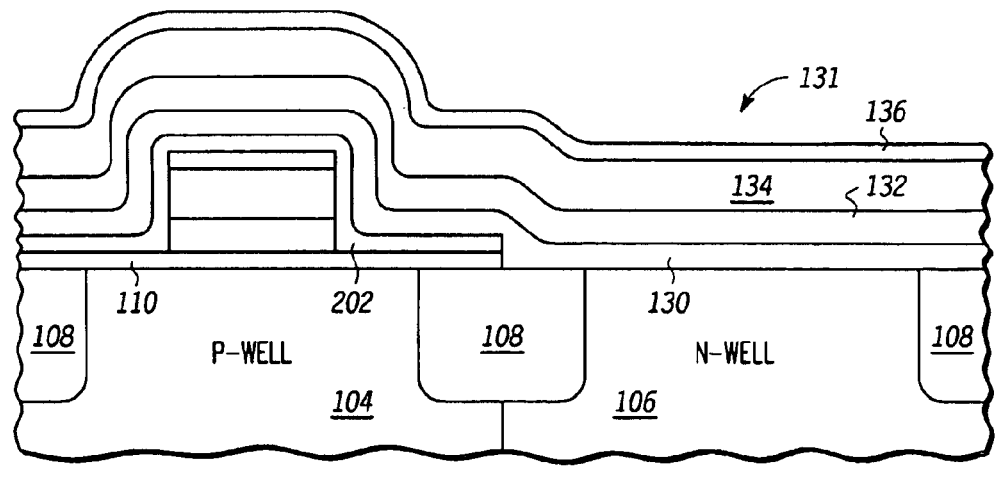
FIG. 14 illustrates processing subsequent to FIG. 13 in which a second gate electrode layer, conductive layer, and antireflective coating are formed over the wafer.
Figure 15:
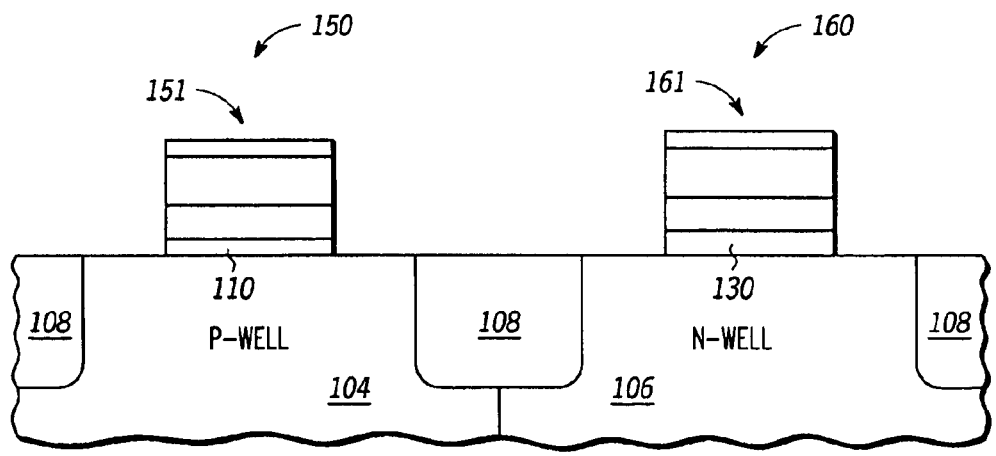
FIG. 15 illustrates processing subsequent to FIG. 14 in which a second gate electrode is formed overlying the second portion of the wafer.
Figure 16:
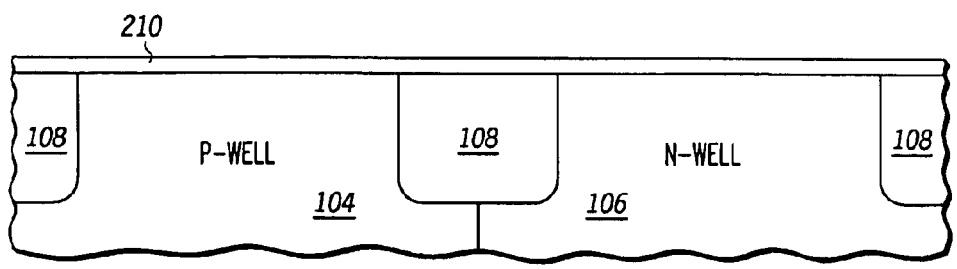
FIG. 16 is a partial cross-sectional view of a semiconductor wafer in which a first gate dielectric layer is formed over the wafer.

In FIG. 14, a second gate stack 131 is formed over wafer 102, where second gate stack 131 has a composition and thickness that is equivalent to the composition and thickness of the first gate stack 111 from which first gate electrode 151 was formed. In FIG. 15, a second gate electrode 161 has been formed by patterning a photoresist layer with a PMOS gate mask and thereafter etching the exposed portions of second gate stack 131. In addition, the hard mask 202 has been removed from the wafer with an appropriate etch process.

One embodiment of the invention includes the use of a two-layer gate dielectric. Two variations of this embodiment include a first variation in which the gate dielectric over both the first and second wells are two-layered and a second variation in which the gate dielectric over one of the wells is a single-layered dielectric while the gate dielectric over the second well is a two-layered dielectric. A first dielectric layer, preferably 5 to 100 angstroms thick, could be the same on both the NMOS and PMOS sides. A second layer, preferably 5 to 20 angstroms thick, has a first composition overlying the first well and a second composition overlying the second well, to produce different gate electrode workfunctions. This second layer is essentially a work-function setting dielectric layer.

Figure 17:
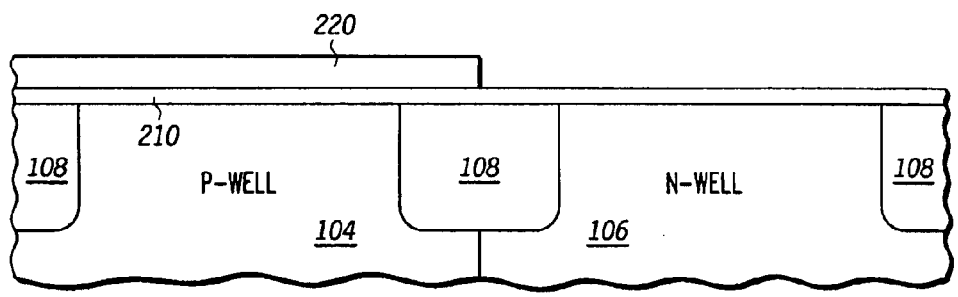
FIG. 17 illustrates processing subsequent to FIG. 16 in which a second gate dielectric layer is formed over a first portion of the wafer.
Figure 18:
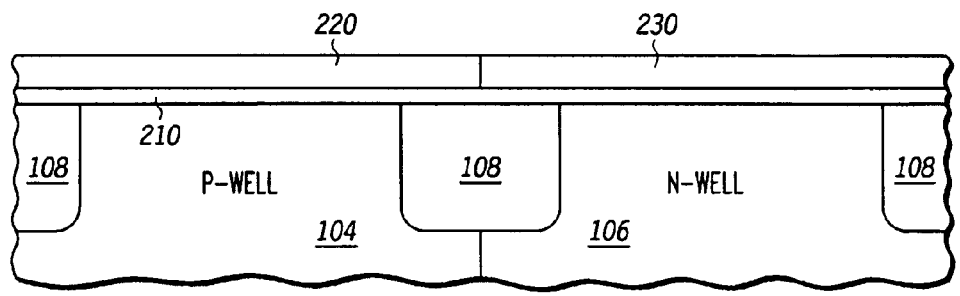
FIG. 18 illustrates processing subsequent to FIG. 17 in which a third gate dielectric layer is formed over a second portion of the wafer.
Figure 19:
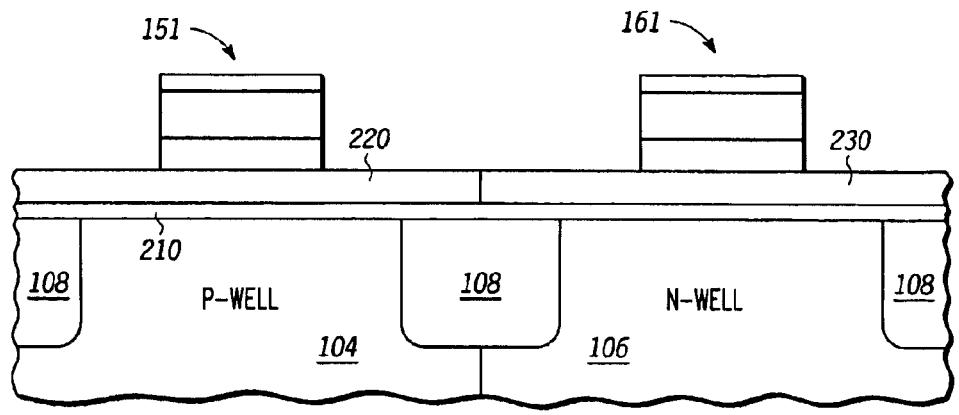
FIG. 19 illustrates processing subsequent to FIG. 18 in which first and second gate electrodes are formed over the first and second portions of the wafer.

Referring now to FIG. 16 through FIG. 19, an embodiment of the invention is depicted in which the first gate dielectric (i.e., the gate dielectric formed overlying first well 104) includes a second dielectric film 220 overlying a first dielectric film 210, which overlies first well 104. The second gate dielectric (i.e., the gate dielectric formed over second well 106) includes a third dielectric film 230 overlying the first dielectric film 210. While this embodiment encompasses the concept of having different gate dielectrics for NMOS and PMOS transistors where the NMOS and PMOS transistors use gate electrodes that are substantially of the same composition, the different gate dielectrics include a common dielectric film. Specifically, referring to FIG. 16, first dielectric film 210 is formed overlying first well 104 and second well 106. In one implementation, first dielectric film 210 is $SiO_2$, Hafnium oxide, or another high-K dielectric having a thickness in the range of approximately 5 to 100 angstroms. First dielectric film 210 may be deposited by atomic layer deposition (ALD), CVD, or PVD. Second dielectric film 220 is then deposited and patterned as seen in FIG. 17 so that second dielectric film 220 remains overlying first well 104 but is removed overlying second well 106. Third dielectric film 230 is then deposited and patterned, as seen in FIG. 18, so that third dielectric film 230 remains overlying second well 106 but is removed overlying first well 104. Second dielectric film 220 is preferably 5 to 20 angstroms of Lanthanum oxide or $LaAlO_3$ while third dielectric film 230 is 5 to 20 angstroms of Aluminum oxide. Like first dielectric film 210, second and third dielectric films 220 and 230 may be formed by ALD, CVD, or PVD. In FIG. 19, first and second gate stacks 151 and 161 are formed overlying first and second wells 104 and 106 respectively.

Figure 20:
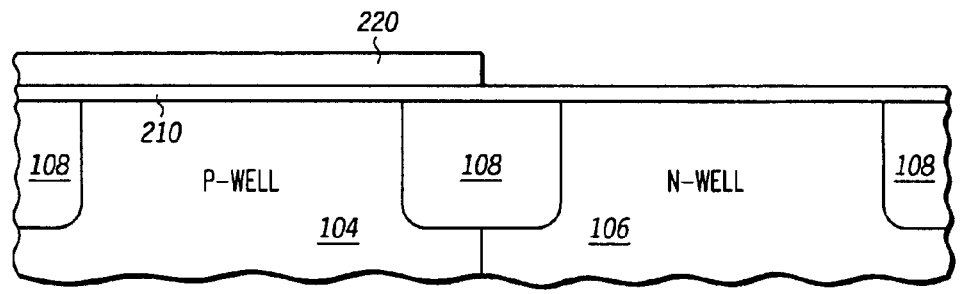
FIG. 20 illustrates processing subsequent to FIG. 16, according to an alternative embodiment, in which a second gate dielectric layer is formed over the first portion of the wafer.
Figure 21:
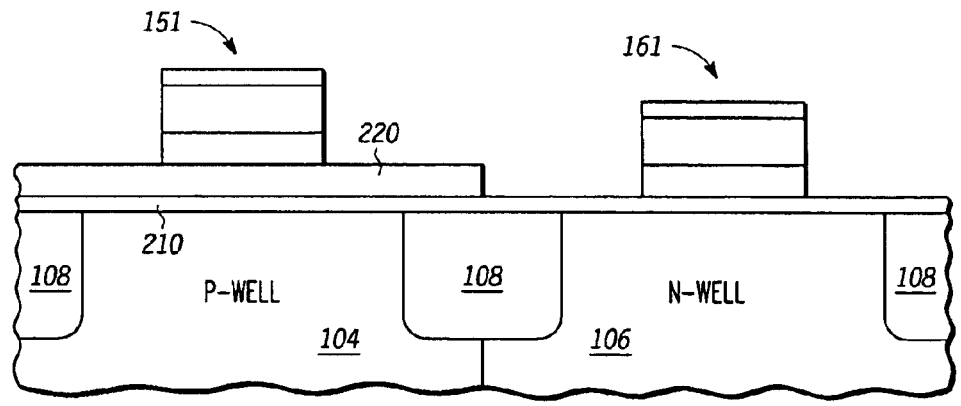
FIG. 21 illustrates processing subsequent to FIG. 20 in which first and second gate electrodes are formed over the first and second portions of the wafer.

Referring to FIG. 20 and FIG. 21, a variation of the sequence described in the preceding paragraph is depicted in which the gate dielectric formed over first well 104 includes second dielectric film 220 overlying first dielectric film 210 while the gate dielectric formed over second well 106 includes first dielectric film 210 overlying the substrate (i.e., second well region 106). This implementation is achieved by depositing first dielectric film 210 and thereafter depositing and patterning second dielectric film 220 to remove portions of second dielectric film 220 overlying second well region 106. In FIG. 21, gate stacks 151 and 161 are formed overlying the first and second gate dielectrics respectively. In one implementation, first dielectric film 210 may be comprised of $SiO_2$, Hafnium oxide, or Aluminum oxide while second dielectric film 220 is Lanthanum oxide.

In the foregoing specification, the invention has been described with reference to specific embodiments. However, one of ordinary skill in the art appreciates that various modifications and changes can be made without departing from the scope of the present invention as set forth in the claims below. For example, an alternative to the device structure shown in FIG. 1 is for first well 104 to be an n-doped well and the second well 106 to be p-doped. Also the first and second gate electrode layers (112, 132) and the first and second conductive layers (114, 134) may be different materials than those disclosed. Moreover, the thickness of the described layers may deviate from the disclosed thickness values. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process, comprising:

forming a first gate dielectric over and in contact with a well region and a second gate dielectric over and in contact with a second well region wherein the compositions of the first and second gate dielectric are different; and forming a first gate electrode over and in contact with the first gate dielectric and a second gate electrode over and in contact with the second gate dielectric wherein the first and second gate electrodes are equivalent in composition and thickness;

wherein the first gate dielectric includes a second dielectric film overlying a first dielectric film on an upper surface of the first well region and wherein the second gate dielectric includes a third dielectric film overlying the first dielectric film on the upper surface of the second well region.

2. The process of claim 1, wherein the first and second gate dielectrics are both high-K dielectrics.

3. The process of claim 2, wherein the first gate dielectric is Lanthanum oxide and the second gate dielectric is Aluminum oxide.

4. The process of claim 3, wherein the first and second gate electrodes include a tantalum-bearing layer over and in contact with the first and second dielectrics respectively.

5. The process of claim 4, wherein the tantalum bearing layer consists substantially of TaC.

6. The process of claim 4, wherein the tantalum bearing layer consists substantially of TaSiN.

7. The process of claim 4, wherein the first and second gate electrodes include a conductive layer over and in contact with the tantalum bearing layer, wherein the conductive layer is selected from the group consisting of polysilicon and tungsten.

8. A semiconductor process, comprising:

forming a first transistor over a first well region and a second transistor over a second well region;

the first transistor having a first gate dielectric and the second transistor having a second gate dielectric different in composition from the first gate dielectric;

the first transistor having a first gate electrode and the second transistor having a second gate electrode, wherein the first and second gate electrodes are the same in composition; and wherein the first gate dielectric and the second gate dielectric are both high-K dielectrics.

9. The process of claim 8, wherein the first gate dielectric is Hafnium oxide and the second gate dielectric is Aluminum oxide.

10. The process of claim 9, wherein the first second gate electrodes both include a gate electrode layer above and in contact with the respective gate dielectrics, wherein the gate electrode layer is selected from a group consisting of TaSiN and TaC.

11. The process of claim 10, wherein the first and second gate electrodes both include a conductive layer over the corresponding gate electrode layer, wherein the conductive layer is selected from the group consisting of polysilicon and tungsten.

12. An integrated circuit, comprising:

a first transistor formed overlying a first well region of a semiconductor substrate, wherein the first transistor includes a first gate electrode overlying a first metal-oxide gate dielectric;

a second transistor formed overlying a second wall region of the semiconductor substrate, wherein the second transistor includes a second gate electrode overlying a second metal-oxide gate dielectric;

wherein the first and second gate dielectrics differ in composition and further wherein the first and second gate electrodes are substantially equivalent in composition and thickness.

13. The integrated circuit of claim 12, wherein the first and second gate dielectric are high-K dielectrics.

14. The integrated circuit of claim 13, wherein the first and second gate electrodes include a conductive layer of a material selected from polysilicon and tungsten overlying a gate electrode layer comprised of a material selected from TaSiN and TaC.

15. The integrated circuit of claim 14, wherein the first gate dielectric is comprised of Lanthanum oxide and the second gate dielectric is comprised of Aluminum oxide.

16. The integrated circuit of claim 12, wherein the first gate dielectric includes a second gate dielectric film overlying a first dielectric film.

17. The integrated circuit of claim 16, wherein the second gate dielectric includes a third gate dielectric film overlying the first dielectric film.

18. The integrated circuit of claim 17, wherein the first dielectric film is comprised of a material selected form $SiO_2$ and Hafnium oxide, the second dielectric film is comprised of Lanthanum oxide, and the third dielectric film is comprised of Aluminum oxide.

19. The integrated circuit of claim 18, wherein the first dielectric film a material selected from Hafnium oxide, Aluminum oxide, and $SiO_2$ and the second dielectric film is Lanthanum oxide.

20. The integrated circuit of claim 16, wherein the second gate dielectric consists of the second dielectric film overlying the second well region.

21. A method for forming over a semiconductor substrate a first gate stack in a first gate location for a transistor of a first conductivity type and a second gate stack in a second gate location for a transistor of the second conductivity, comprising:

forming a first gate dielectric layer over the first gate location and the second gate location, wherein the first gate dielectric layer comprises a first high-k dielectric;

removing the first gate dielectric layer in an area over the second gate location;

forming a second gate dielectric over the first gate location and the second gate location, wherein the second gate dielectric layer comprises a second high-k dielectric different from the first high-k dielectric;

removing the second gate dielectric in an area over the first gate location;

forming a first gate layer over the first gate location and the second gate location;

removing a first portion of the gate layer to leave a second portion of the first gate layer over the first gate location; and forming a second gate layer over the first gate location and the second gate location;

wherein the removing the first gate dielectric layer occurs before the forming the first gate electrode layer.

22. The method of claim 21, wherein the first conductivity type is N type, the first high-k dielectric comprises lanthanum oxide, the second conductivity type is P-type, and the second high-k dielectric comprises aluminum oxide.

23. The method of claim 21, wherein the removing the first gate dielectric layer occurs after the forming the first gate electrode layer.

* * * * *

UNITED STATES PATENT AND TRADEMARK OFFICE
CERTIFICATE OF CORRECTION

| | | |
|---|---|---|
| PATENT NO. | : 6,897,095 B1 | |
| APPLICATION NO. | : 10/843850 | |
| DATED | : May 24, 2005 | |
| INVENTOR(S) | : Olubunmi O. Adetutu et al. | |

It is certified that error appears in the above-identified patent and that said Letters Patent is hereby corrected as shown below:

In Column 7, Line 6, Claim No. 1:

Change "dielectric" to --dielectrics--.

In Column 7, Line 35, Claim No. 8:

Change "semiconductor process" to --semiconductor fabrication process--.

In Column 7, Line 49, Claim No. 10:

Change "first second gate" to --first and second gate--.

In Column 8, Line 8, Claim No. 14:

Change "cohductive" to --conductive--.

In Column 8, Line 52, Claim No. 21:

Change "the gate layer" to --the first gate layer--.

Signed and Sealed this

Twenty-fourth Day of April, 2007

JON W. DUDAS
*Director of the United States Patent and Trademark Office*